United States Patent
Lee

(10) Patent No.: US 7,684,266 B2
(45) Date of Patent: Mar. 23, 2010

(54) SERIAL SYSTEM FOR BLOWING ANTIFUSES

(75) Inventor: Derek Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 315 days.

(21) Appl. No.: 11/734,141

(22) Filed: Apr. 11, 2007

(65) Prior Publication Data

US 2008/0251887 A1 Oct. 16, 2008

(51) Int. Cl.
*G11C 29/00* (2006.01)
(52) U.S. Cl. .................................... 365/200; 365/225.7
(58) Field of Classification Search .................. 365/200, 365/225.7, 105
See application file for complete search history.

(56) References Cited

U.S. PATENT DOCUMENTS

| 6,108,260 | A | 8/2000 | Casper |
| 6,163,488 | A | 12/2000 | Tanizaki et al. |
| 6,201,750 | B1 * | 3/2001 | Busch et al. ............. 365/225.7 |
| 6,205,063 | B1 * | 3/2001 | Aipperspach et al. ....... 365/200 |
| 6,242,943 | B1 | 6/2001 | El-Ayat |
| 6,426,911 | B1 * | 7/2002 | Lehmann et al. ......... 365/225.7 |
| 6,509,624 | B1 | 1/2003 | Radens et al. |
| 6,545,926 | B2 | 4/2003 | Ooishi et al. |
| 7,132,325 | B2 | 11/2006 | Abadeer et al. |
| 7,405,989 | B2 * | 7/2008 | Chung .................... 365/225.7 |
| 2006/0227643 | A1 | 10/2006 | Nakagawa et al. |
| 2007/0121411 | A1 * | 5/2007 | Riley ...................... 365/225.7 |

* cited by examiner

*Primary Examiner*—Vu A Le
(74) *Attorney, Agent, or Firm*—Knobbe, Martens, Olson & Bear, LLP

(57) ABSTRACT

A serial system and method for blowing antifuses are disclosed. One embodiment of antifuse system includes a plurality of latch devices connected in series from input to output. The system also includes a plurality of antifuses. The antifuses are configured to receive an output signal from a corresponding one of the latch devices. The plurality of latch devices includes a plurality of D flip-flops connected in series. Each of the D flip-flops is configured to receive an output signal from an immediately previous D flip-flop in the serial data flow and to provide an output signal to an immediately subsequent D flip-flop in the flow. In addition, the serial system provides self-detective antifuses, thus creating reliable electrical paths while saving antifuse blowing current resources and time.

22 Claims, 12 Drawing Sheets

SERIAL SYSTEM FOR BLOWING ANTIFUSES

BACKGROUND OF THE INVENTION

1. Field of the Invention

Embodiments of the invention relate to semiconductor devices, and more particularly, to semiconductor devices including antifuses.

2. Description of the Related Art

An antifuse has a high resistance in its initial state. An antifuse can permanently create an electrically conductive path when a relatively high voltage is applied across the antifuse. An antifuse can have a structure similar to that of a capacitor, i.e., two conductive electrical terminals are separated by a dielectric layer. To create an electrically conductive path, a relatively high voltage is applied across the terminals, breaking down the interposed dielectric layer and forming a conductive link between the antifuse terminals. Creating a conductive path through an antifuse is referred to as "blowing an antifuse."

Antifuses are often used in memory cell arrays such as dynamic random access memories (DRAMs). For example, after testing a DRAM, failed cells in the DRAM can be repaired by remapping. An antifuse typically stores the remapping.

FIG. 1 illustrates a conventional parallel antifuse system 100. The illustrated system includes decoders 101-104 and antifuses 111-114. Each of the antifuses 111-114 has a unique address associated with it. The decoders 101-104 are configured to receive and decode signals from a controller (not shown) to blow selected antifuses 111-114. The illustrated system 100 uses a parallel scheme to access the antifuses 111-114 in that each of the antifuses 111-114 are individually and separately accessed using their unique addresses.

As the number of antifuses in a device increases, this parallel scheme can be slow to program and wasteful of chip area. The parallel scheme uses a relatively large logic circuit to decode the addresses of the antifuses. In addition, complex routing may be required to provide access to the antifuses. For example, in a memory device (e.g., DRAM) having large numbers of rows and columns in its memory array, the parallel scheme can substantially complicate the design of the device.

In addition, it is often desirable to detect whether antifuses have been fully blown to determine whether a desired electrical path has been created. In one arrangement, a fixed blowing time is given for each antifuse. Such a fixed blowing time can be redundant or insufficient depending on the antifuses being blown. If it is redundant, it can result in a waste of time and current resources to blow antifuses. On the other hand, if it is insufficient, a desired electrical path may not be established.

BRIEF DESCRIPTION OF THE DRAWINGS

The embodiments will be better understood from the Detailed Description of the Embodiments and from the appended drawings, which are meant to illustrate and not to limit the embodiments, and wherein.

DETAILED DESCRIPTION OF EMBODIMENTS

Serial System for Blowing Antifuses

In one embodiment, a serial antifuse system is provided to blow a plurality of antifuses. In the serial antifuse system, antifuses are accessed in series, and are sequentially blown. This serial system does not use unique parallel addresses for individual antifuses. Thus, the serial system does not increase the amount of logic to decode the addresses of the antifuses as the number of antifuses increases. In addition, the serial system can minimize routing needs for the increased number of antifuses.

The serial system according to one embodiment also determines whether antifuses have been fully blown. The serial system is configured to blow antifuses in a sequential manner. Thus, the system permits relatively good use of blowing time and electrical current resources for the antifuse programming.

Although serially connected, the antifuses can be selectively blown based on a sequence. In the parallel method described above, each antifuse has a unique address and thus a specific antifuse can be selectively blown. In the illustrated serial system, antifuses are not provided with unique parallel addresses. Nevertheless, antifuses can be selectively blown using a "handshaking" method.

In one embodiment, an antifuse circuit receives a ready signal from an antifuse circuit that is immediately prior in the serial data flow. In the context of this document, the term "antifuse circuit" refers to a circuit including an antifuse and a logic circuit configured to blow the antifuse. In the context of this document, the "ready signal" can be used interchangeably with a "triggering signal." If an antifuse needs to be blown, an antifuse circuit including the antifuse starts a blowing operation upon receiving a ready signal. If an antifuse circuit has completed a blowing operation, the antifuse circuit provides another ready signal to an antifuse circuit that is immediately subsequent in the serial data flow. If, however, an antifuse does not need to be blown, an antifuse circuit including the antifuse can simply provide another ready signal to an immediately subsequent antifuse circuit.

Selective Antifuse Blowing Under Serial System

Figure 1:
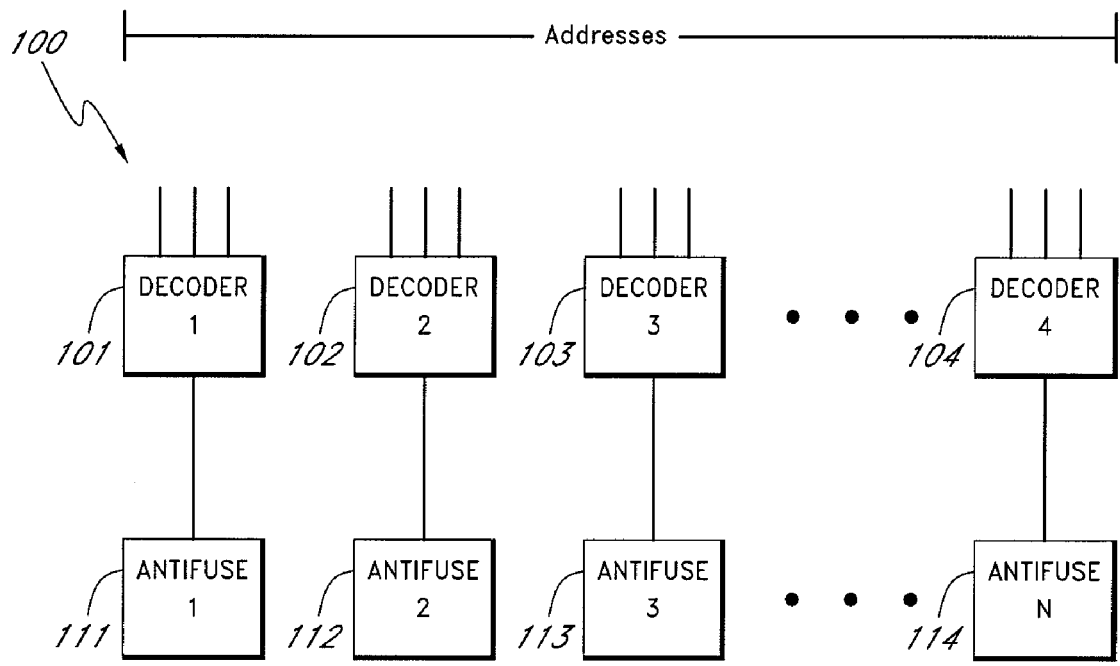
FIG. 1 is a block diagram of a conventional parallel antifuse system.
Figure 2:
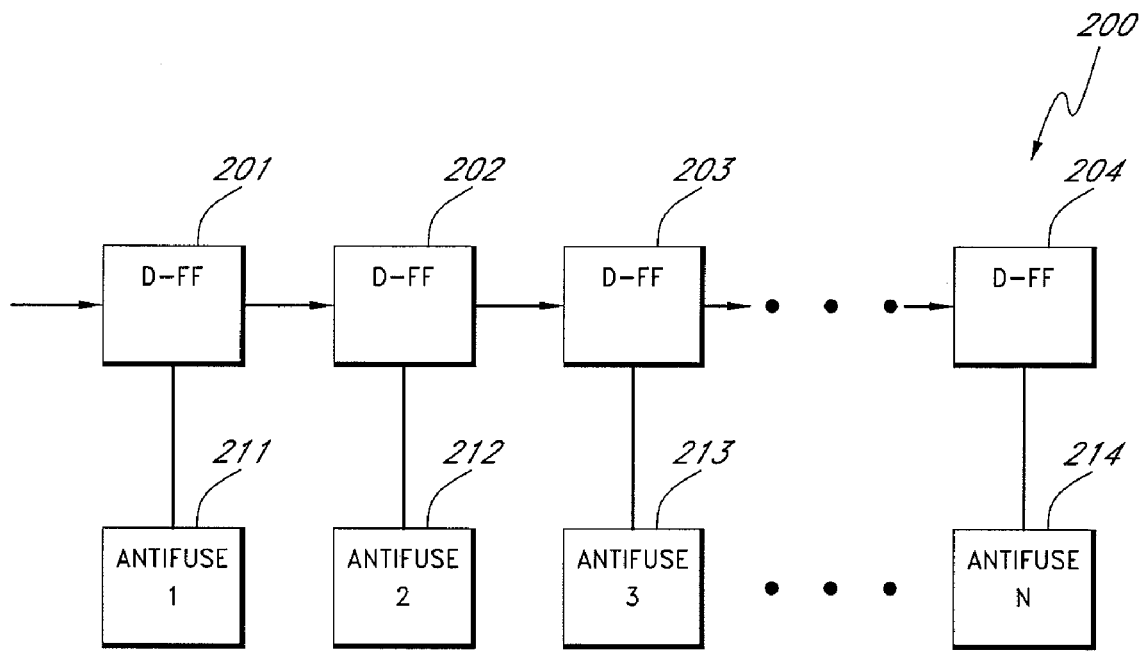
FIG. 2 is a block diagram of a serial antifuse system in accordance with one embodiment.

FIG. 2 is a block diagram illustrating an antifuse system 200 configured to serially blow multiple antifuses according to one embodiment. The antifuse system 200 includes flip-flops or latches 201-204 and antifuse circuits 211-214. The flip-flops 201-204 are connected in series to one another. Each of the antifuse circuits 211-214 is connected to a corresponding one of the flip-flops 201-204.

The flip-flops 201-204 serve to hold a sequence indicative of which antifuses are to be blown. In the illustrated embodiment, the flip-flops 201-204 are D flip-flops. A skilled artisan will appreciate that various other configurations of flip-flops or latch devices can also be adapted for use with the antifuse system 200.

The antifuse circuits 211-214 are configured to blow antifuses therein to create electrically conductive paths. Each of the antifuses in the antifuse circuits 211-214 initially is a relatively high resistance. The antifuse circuits 211-214 are configured to flow a current to "blow" the antifuses therein to a relatively low resistance.

Figure 3:
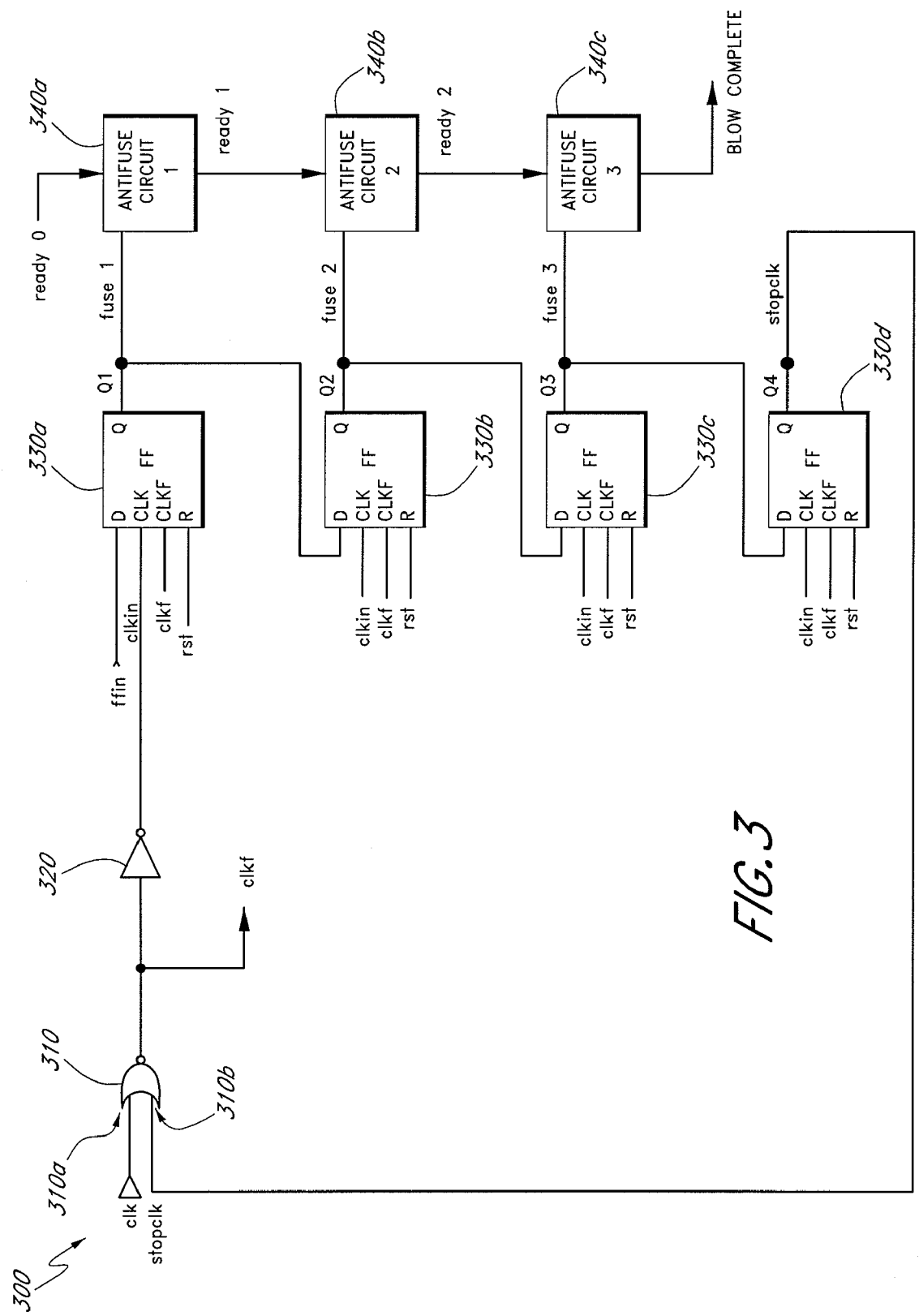
FIG. 3 is a circuit diagram of a serial antifuse system in accordance with one embodiment.

FIG. 3 illustrates an antifuse system 300 according to one embodiment. The antifuse system 300 includes a NOR gate 310, an inverter 320, D flip-flops 330a-330d, and antifuse circuits 340a-340c. The D flip-flops include a first, second, third, and fourth D flip-flops 330a-330d connected in series. The antifuse circuits include a first, second, and third antifuse circuits 340a, 340b, 340c. The antifuse circuits will be described in more detail later. While described in the context of 3 antifuse circuits, the principles and advantages are applicable to a very broad range for the number of antifuse circuits.

The NOR gate 310 includes a first input 310a and a second input 310b. The first input 310a receives a clock signal clk. The second input 310b receives a stop clock signal stopclk. The NOR gate 310 performs a NOR logic operation on the clock signal clk and the stop clock signal stopclk, and provides an output signal clkf to the inverter 320 and the D flip-flops 330a-330d.

The inverter 320 includes an input and an output. The input of the inverter 320 is connected to the output of the NOR gate 310. The output of the inverter 320 is connected to each of the D flip-flops 330a-330d. The inverter 320 is configured to invert the output clkf from the NOR gate 310 and to provide an inverter output signal clkin to the D flip-flops 330a-330d.

The first D flip-flop 330a has a first input D to receive an antifuse selection signal ffin from a controller or a tester (not shown) such as from automated test equipment (ATE). The first D flip-flop 330a has a second input CLK to receive the output signal clkin from the inverter 320. In addition, the first D flip-flop 330a has a third input CLKF to receive the output signal clkf from the NOR gate 310. The first D flip-flop 330a also has a fourth input R to receive a reset signal rst from the controller (not shown). The first D flip-flop 330a also has an output Q to provide an output signal Q1 to the second D flip-flop 330b and the first antifuse circuit 340a.

The second D flip-flop 330b has a first input D configured to receive the output signal Q1 from the first D flip-flop 330a. The second D flip-flop 330b has a second input CLK to receive the output signal clkin from the inverter 320. In addition, the second D flip-flop 330b has a third input CLKF to receive the output signal clkf from the NOR gate 310. The second D flip-flop 330b also has a fourth input R to receive a reset signal rst from the controller. The second D flip-flop 330b also has an output to provide an output signal Q2 to the third D flip-flop 330c and the second antifuse circuit 340b.

The third D flip-flop 330c has a first input D to receive the output signal Q2 from the second D flip-flop 330b. The third D flip-flop 330c has a second input CLK to receive the output signal clkin from the inverter 320. In addition, the third D flip-flop 330c has a third input CLKF to receive the output signal clkf from the NOR gate 310. The third D flip-flop 330c also has a fourth input R to receive a reset signal rst from the controller. The third D flip-flop 330c also has an output to provide an output signal Q3 to the fourth D flip-flop 330d and the third antifuse circuit 340c.

The fourth D flip-flop 330d has a first input D to receive the output signal Q3 from the third D flip-flop 330c. The fourth D flip-flop 330d has a second input CLK to receive the output signal clkin from the inverter 320. In addition, the fourth D flip-flop 330d has a third input CLKF to receive the output signal clkf from the NOR gate 310. The fourth D flip-flop 330d also has a fourth input R to receive a reset signal rst from the controller. The fourth D flip-flop 330d also has an output to provide an output signal Q4 or stopclk to the second input 310b of the NOR gate 310.

The first antifuse circuit 340a includes a first input, a second input, and an output. The first input of the first antifuse circuit 340a receives the output signal Q1 from the first D flip-flop 330a. The second input of the first antifuse circuit 340a receives a zeroth ready signal ready 0 from the controller. The output of the first antifuse circuit 340a outputs a first ready signal ready 1 to the second antifuse circuit 340b.

Similarly, the second antifuse circuit 340b includes a first input, a second input, and an output. The first input of the second antifuse circuit 340b receives the output signal Q2 from the second D flip-flop 330b. The second input of the second antifuse circuit 340b receives the first ready signal ready 1 from the first antifuse circuit 340a. The output of the second antifuse circuit 340b outputs a second ready signal ready 2 to the third antifuse circuit 340c.

The third antifuse circuit 340c also includes a first input, a second input, and an output. The first input of the third antifuse circuit 340c receives the output signal Q3 from the third D flip-flop 330c. The second input of the third antifuse circuit 340c receives the second ready signal ready 2 from the second antifuse circuit 340b. In the illustrated embodiment with 3 antifuse circuits, the output of the third antifuse circuit 340c outputs a blow complete signal to the controller or another component which uses information on the status of blowing the antifuses.

It will be appreciated that a corresponding number of D flip-flops can be connected in series with one another and to the antifuses. In one embodiment, an antifuse system can include N number of antifuses and N+1 number of D flip-flops.

Referring back to FIG. 3, the operation of the antifuse system 300 is described below. The controller or tester (not shown) provides an antifuse selection signal ffin to the first input D of the first D flip-flop 330a.

In one embodiment, the antifuse selection signal ffin includes an antifuse selection sequence having a predetermined number of bits. The predetermined number can be equal to the number of the antifuses plus one (1). In the illustrated configuration, the sequence starts with a leading "1" followed by a predetermined number of data bits (0s or 1s) based on the number of antifuses in the string. The predetermined number of data bits (0s or 1s) are indicative of which antifuses are to be blown. The 1s indicate antifuses to be blown whereas the 0s indicate antifuses not to be blown. The sequence of the predetermined number of 0s and is 1s in the reverse order of the antifuse circuits 340a-340c connected in series. For example, if the antifuses of the second and third antifuse circuits 340b, 340c of FIG. 3 are to be blown, the sequence is 1 (leading 1), 1 (for the third antifuse circuit 340c), 1 (for the second antifuse circuit 340b), 0 (for the first antifuse circuit 340a). In another example, if only the first antifuse circuit 330a is to be blown, the sequence is 1, 0, 0, 1. In the context of this document, the value "1" can be used interchangeably with a "high (H)" signal. In addition, the value "0" can be used interchangeably with a "low (L)" signal.

The antifuse selection signal ffin is clocked in to the D flip-flops 330a-330c by the clock signal clk one bit by one bit. The leading "1" is input to the first D flip-flop 330a, and then is output to the second D flip-flop 330b at the next clock. Next, the leading "1" is input to the second D flip-flop 330b and then is output to the third D flip-flop 330c at the third clock. The leading "1" is input to the third D flip-flop 330c and then is output to the fourth D flip-flop 330d at the fourth clock. The leading "1" is input to the last D flip-flop 330d (the fourth D flip-flop in FIG. 3) at the fifth clock. Then, the leading "1" is output to the second input 310b of the NOR gate 310 as a stop clock signal stopclk. Because one of the inputs of the NOR gate 310 is "1" (i.e., the second input 310b is latched by the stop clock signal stopclk at "1"), the output of the NOR gate 310 is now always "0." This results in stopping the clock-in signal clkin from being supplied to the second inputs CLK of the D flip-flops 330a-330d. This also stops the antifuse selection signal ffin from being provided to the D flip-flops 330a-330d. Thus, the sequence supplied so far is latched at the flip-flops 330a-330d. In summary, the antifuse system 300 is configured to apply the antifuse selection sequence for a period of clocks corresponding to the number of the bits in the sequence. The bits in the sequence are maintained at the flip-flops 330a-330d until a reset signal rst is supplied thereto.

Figure 5:
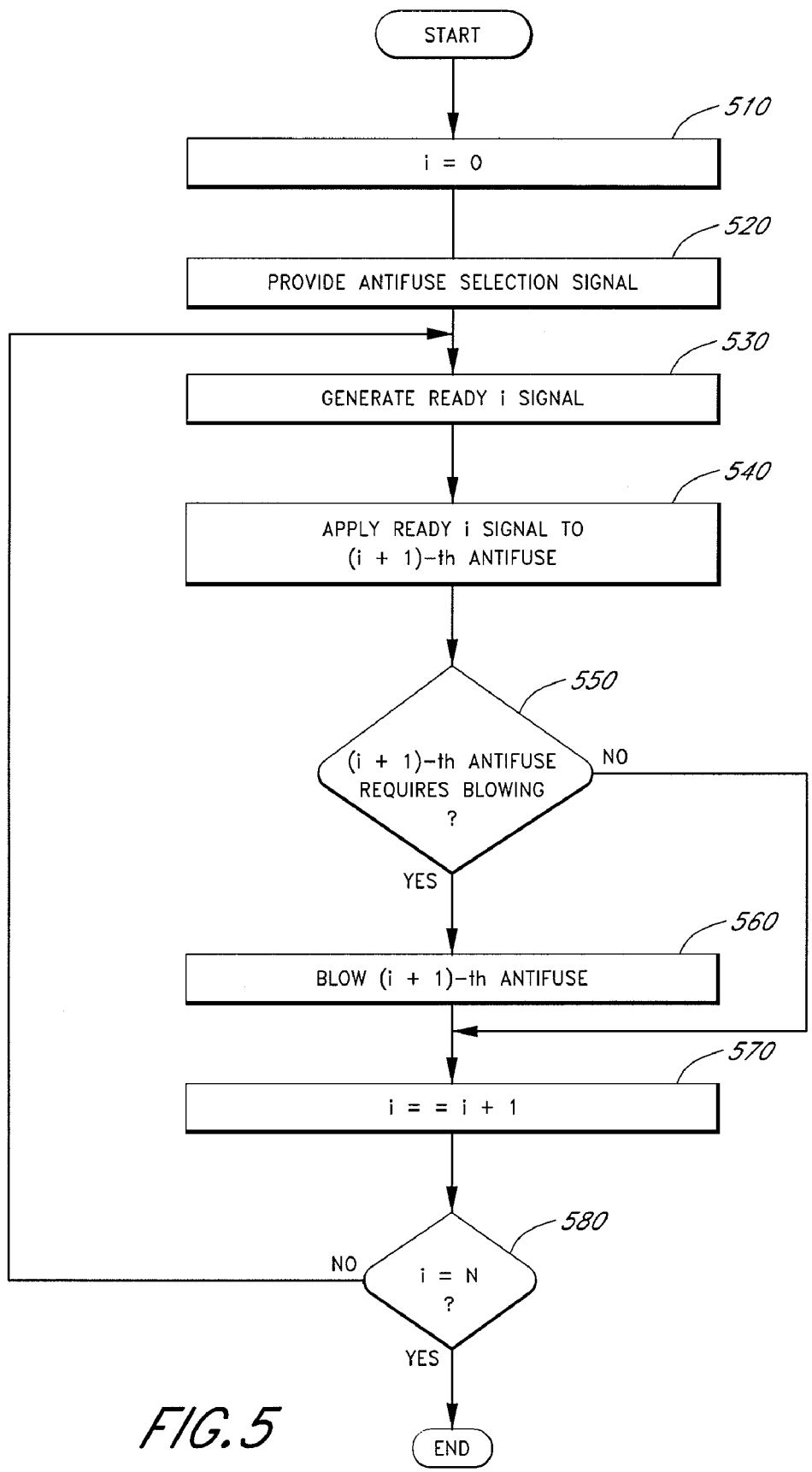
FIG. 5 is flowchart of a method of blowing antifuses connected in series in accordance with one embodiment.

Referring now to FIGS. 3 and 5, a method of blowing antifuses connected in series is described. The method is used to blow N number of antifuses connected in series. In the method, a ready i signal is used to trigger blowing an (i+1)-th antifuse. In FIG. 5, some of the blocks can be omitted. In other embodiments, two or more of the blocks can be combined together.

Referring to FIG. 5, in block 510, "i" is set to "0" and the circuit is initialized. At this step, the D flip-flops 330a-330d are reset. In addition, the antifuse circuits 340a-340c are unprogrammed. A clock signal is not provided at this step.

In block 520, the D flip-flops 330a-330d are provided with an antifuse selection sequence ffin indicative of which antifuses are to be blown. The D flip-flops 330a-330d hold the sequence ffin at the antifuse circuits 340a-340c.

Next, in block 530, a ready i signal is generated. A first ready i signal is ready 0 signal (FIG. 3) which is generated by a controller or tester. Then, in block 540, the ready i signal is applied to an (i+1)-th antifuse. For example, the ready 0 signal is applied to the first antifuse circuit 330a (FIG. 3).

Then, in block 550, it is determined whether the (i+1)-th antifuse is to be blown. This is determined by the antifuse selection signal ffin which has been held by the D flip-flops 330a-330d (FIG. 3). If the (i+1)-th antifuse is to be blown, the (i+1)-th antifuse is blown in block 560. Subsequently, in block 570, "i" is increased by one (1). If, however, the (i+1)-th antifuse is not to be blown, "i" is increased by one (1) in block 570 without blowing the (i+1)-th antifuse.

Next, in block 580, it is determined whether "i" is equal to N, i.e., the number of the antifuses connected in series. If i is not equal to N, the process goes back to block 530, and generates another ready i signal with i incremented by one (1). Then, the process goes through the blocks 530 to 580 until i reaches N. If i is equal to N, the process is terminated, completing the blowing operation.

In case one of the antifuses to be blown has been damaged and thus cannot be blown, the antifuse blowing operation can be stopped without establishing a desired electrical path. In one embodiment, a timer can be used to monitor if the blow complete signal is provided within a time limit, thereby determining if there is any damaged antifuse in serially-connected antifuses.

Self-Detective Antifuse Blowing in Serial System

Figure 4:
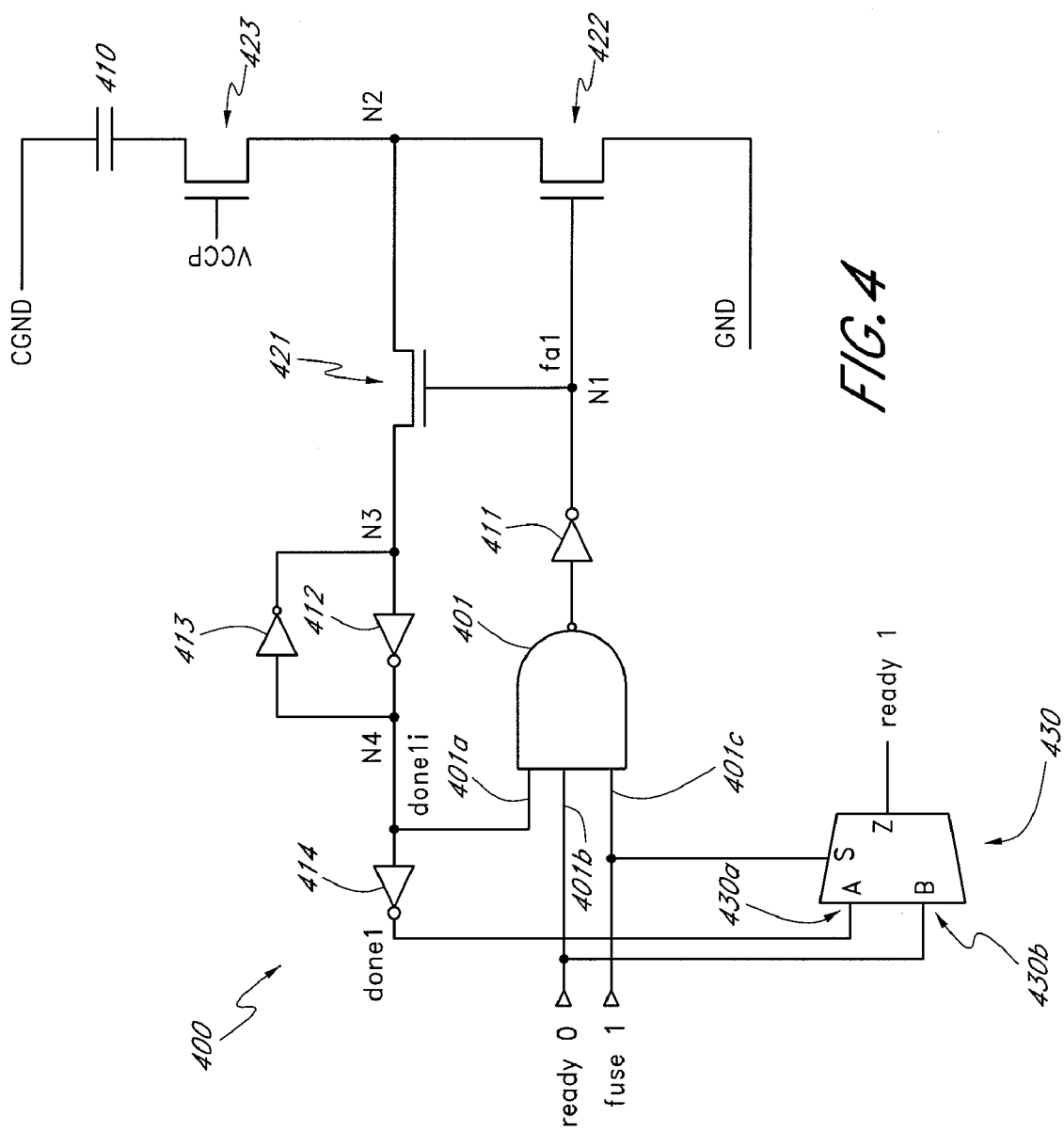
FIG. 4 is a circuit diagram of an antifuse circuit in accordance with one embodiment.

FIG. 4 is a circuit diagram of one embodiment of an antifuse circuit 400. The illustrated antifuse circuit 400 can be the first antifuse 340a of FIG. 3. However, other antifuse circuits can also have the configuration of the antifuse circuit 400. The antifuse circuit 400 includes an antifuse 410, a NAND gate 401, first to fourth inverters 411-414, first to third transistors 421-423, a multiplexer 430, and first to fourth nodes N1-N4.

The antifuse 410 includes a first terminal connected to a CGND node and a second terminal connected to the second node N2. The CGND node can be connected to a power supply provided by the controller or tester (not shown) during an antifuse blowing operation which will be described below. After completion of an antifuse blowing operation, the CGND node can be connected to ground. When the antifuse 410 is blown, an electrically conductive path is permanently established through the antifuse 410. In one embodiment, the power supply for the CGND node can provide a voltage between about 0 V and about 10V, and particularly between about 0 V and about 8 V.

The NAND gate 401 includes a first, second, and third inputs, 401a-401c. The first input 401a receives an output from the second inverter 412. The second input 401b receives a ready signal. The illustrated antifuse circuit 400 will be described in the context of a first antifuse circuit (e.g., the first antifuse circuit 340a of FIG. 3) among a plurality of antifuse circuits connected in series, and thus is configured to receive a zeroth ready signal ready 0 from the controller. Other antifuses (e.g., the second and third antifuse circuits 340b and 340c of FIG. 3) can receive a ready signal from an immediately previous antifuse. The third input 401c receives an output signal Q1 or fuse 1 from the first D flip-flop 330a (FIG. 3). The NAND gate 401 performs a NAND operation and provides an output signal to the first inverter 411.

The first inverter 411 is configured to invert the output signal from the NAND gate 401 and to provide an inverter output signal to the first transistor 421 and the second transistor 422. The first inverter 411 has an input connected to the output of the NAND gate 401 and an output connected to the first node N1.

The first transistor 421 serves as a switch between the second and third nodes N2 and N3. In the illustrated embodiment, the first transistor 421 is an N-type MOS transistor. The first transistor 421 has a source connected to the node N2, a drain connected to the third node N3, and a gate connected to the first node N1. It will be appreciated that the source and the drain can be swapped.

The second inverter 412 is configured to invert an output signal from the first transistor 421 and to provide an output signal done1i to the third and fourth inverters 413, 414 and the first input 401a of the NAND gate 401. The second inverter 412 has an input connected to the third node N3 and an output connected to the fourth node N4.

The third inverter 413 is configured to invert the output signal done1i from the second inverter 412 and to provide an output signal back to the input of the second inverter 412. The third inverter 413 has an input connected to the fourth node N4 and an output connected to the third node N3. The second and third inverters 412, 413 are in combination configured to form a "keeper," which keeps voltages at both ends held until a signal having a certain voltage level is supplied to the third node N3. The third inverter 413 is smaller in size than the second inverter 412 such that a voltage passing through the second inverter 412 is sufficiently strong to override the third inverter 413.

The fourth inverter 414 is configured to invert an output signal done1i from the second inverter 412 and to provide an output signal done1 to the multiplexer 430. The fourth inverter 414 has an input connected to the fourth node N4 and an output connected to a first input 430a of the multiplexer 430.

The multiplexer 430 is configured to switch the output signal done1 from the fourth inverter 414 and the ready signal ready 0 in response to a state of the output signal Q1 or fuse 1 from the first D flip-flop 330a (FIG. 3) and to provide a ready signal ready 1 to the immediately subsequent antifuse circuit 340b (FIG. 3). The multiplexer 430 has a first input A connected to the output of the fourth inverter 414, a second input B connected to the controller (not shown), a selector input S connected to the output of the first D flip-flop 330a (FIG. 3), and an output Z connected to the second antifuse 340b (FIG. 3). The illustrated multiplexer 430 is a 2-to-1 multiplexer which has a truth table shown in Table 1.

TABLE 1

| S | A | B | Z |
|---|---|---|---|
| 0 | 1 | 1 | 1 |
|   | 1 | 0 | 0 |
|   | 0 | 1 | 1 |
|   | 0 | 0 | 0 |
| 1 | 1 | 1 | 1 |
|   | 1 | 0 | 1 |
|   | 0 | 1 | 0 |
|   | 0 | 0 | 0 |

The second transistor 422 serves as a switch between ground GND and the second node N2. In the illustrated embodiment, the second transistor 422 is an N-type MOS transistor. The second transistor 422 has a source/drain (if applicable) connected to the second node N2, a source/drain connected to ground GND, and a gate connected to the first node N1.

The third transistor 423 serves to protect the transistors 421 and 423. The third transistor 423 is configured to pass a voltage from the antifuse 410 therethrough to the second node N2 while preventing the voltage of the second node N2 from rising above the level of a VCCP signal. In the illustrated embodiment, the third transistor 423 is an N-type MOS transistor. The third transistor 423 has a source/drain connected to the second terminal of the antifuse 410, a drain/source connected to the second node N2, and a gate configured to receive a VCCP signal. The VCCP signal is a digital signal. The VCCP signal can have a voltage level sufficient to allow a full strength signal to pass through the third transistor 423. The operation of the antifuse circuit 400 will be described in greater detail later in connection with FIGS. 6A-6F.

In the illustrated embodiment, the transistors 421-423 are N-type transistors. A skilled artisan will, however, appreciate that each of the transistors 421-423 can be of P-type depending on the design of the circuit. A skilled artisan will also appreciate that the source and drain of each of the transistors 421-423 can be swapped in many low voltage ICs. Although not shown, the controller or tester (not shown) is configured to provide the power supply for the CGND node.

Referring to FIGS. 6A-6F, the operation of the antifuse circuit 400 of FIG. 4 is described below. The illustrated antifuse circuit 400 is capable of self-detecting whether the antifuse has been blown.

Figure 6A:
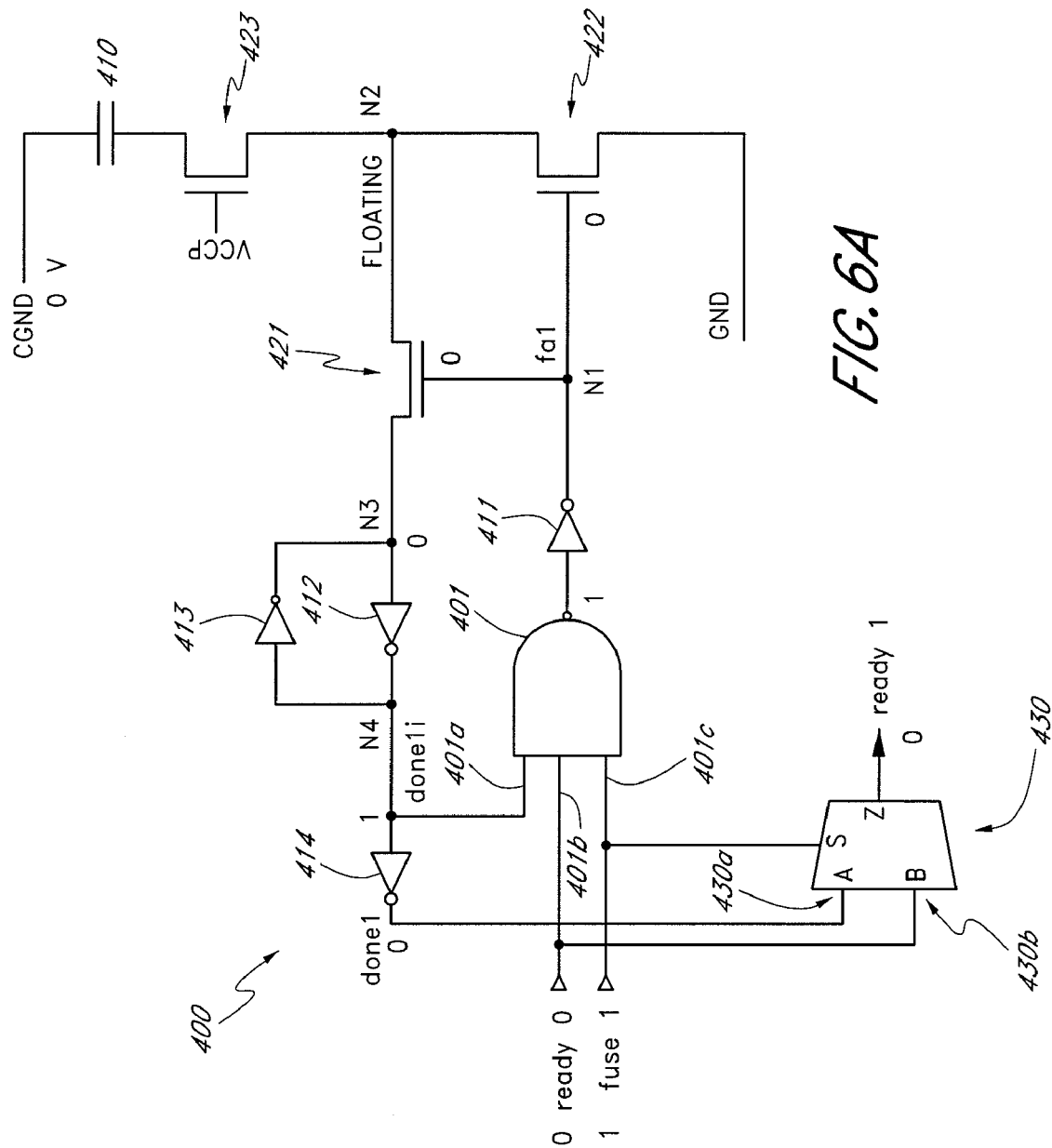
FIGS. 6A-6F are circuit diagrams illustrating a method of blowing an antifuse in accordance with one embodiment.
Figure 6B:
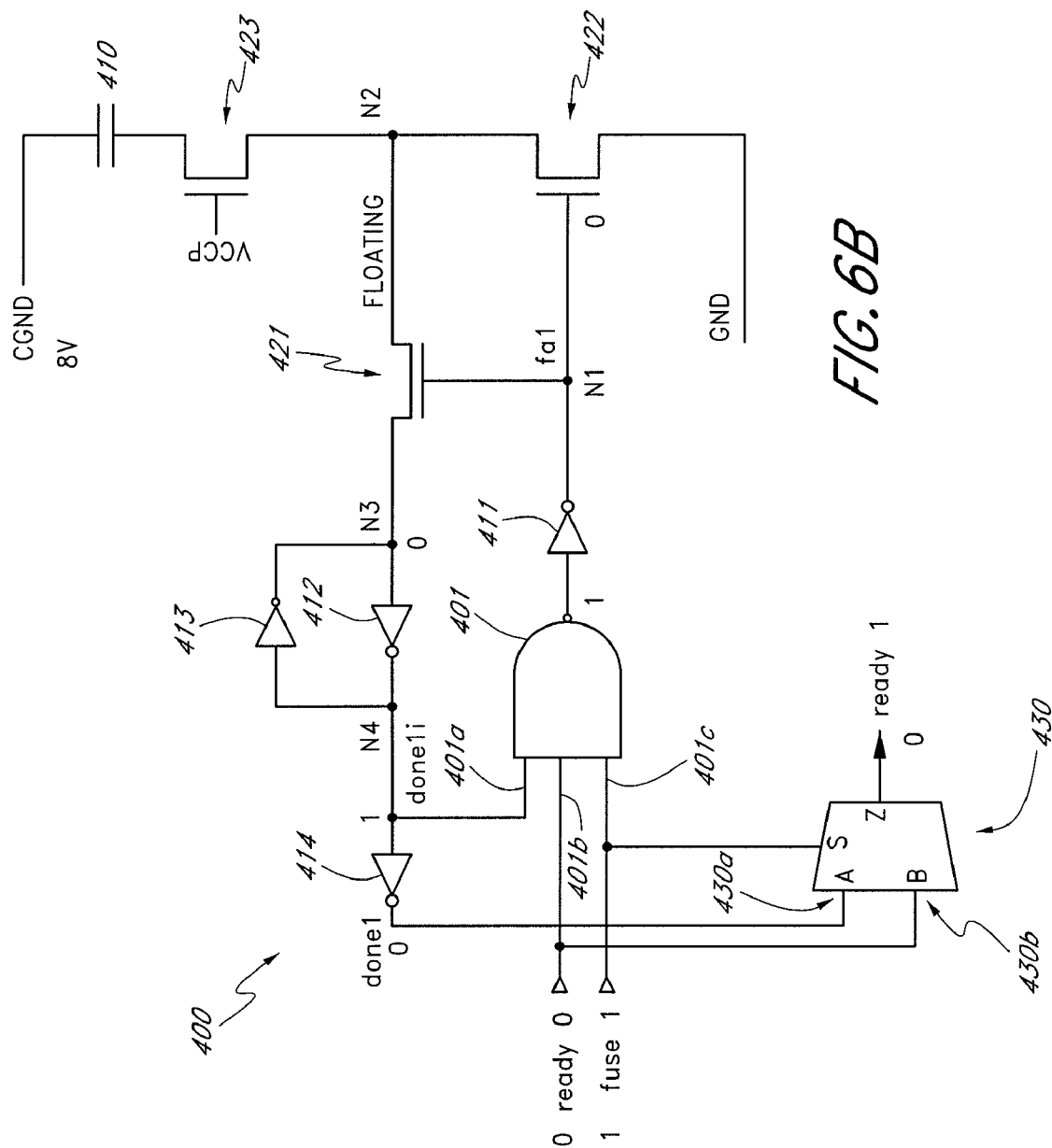

FIG. 6A illustrates an antifuse circuit 400 which has been selected to be blown. The antifuse circuit 400 will be described in the context of the first antifuse circuit 340a of FIG. 3, which has been provided with a fuse 1 signal having a value of "1" from the first D flip-flop 330a to indicate blowing. At the illustrated state, the ready 0 signal is "0." The NAND gate 401 generates "1" at its output because at least one of the inputs is "0." Then, the first inverter 411 inverts the NAND gate output and generates "0" at its output. Thus, the first node N1 has a value of "0." The first and second transistors 421, 422 are off at this state. In addition, the CGND node is at 0 V at this state. The VCCP signal is supplied to turn on the third transistor 423. The VCCP signal is supplied through-out the operation of the antifuse circuit 400. The second node N2 is floating at this state. The third node N3 is set at "0" by the relative sizes of the transistors within the second and third inverters 412, 413 upon initializing to its initial state. The second inverter 412 inverts the value of the third node N3, and generates "1" at the fourth node N4. Then, the fourth inverter 414 inverts the value of the fourth node N4, and generates "0" at its output done1. The output of the fourth inverter 414 is applied to the first input 430a of the multiplexer 430. The multiplexer 430 also receives the ready 0 signal which is "0" at the second input 430b thereof and the fuse 1 signal which is "1" at the selector input S thereof. The output Z of multiplexer 430 is at "0" at this state, which indicates to the subsequent stage that the antifuse circuit 400 is not ready. See Table 1 above.

Figure 6C:
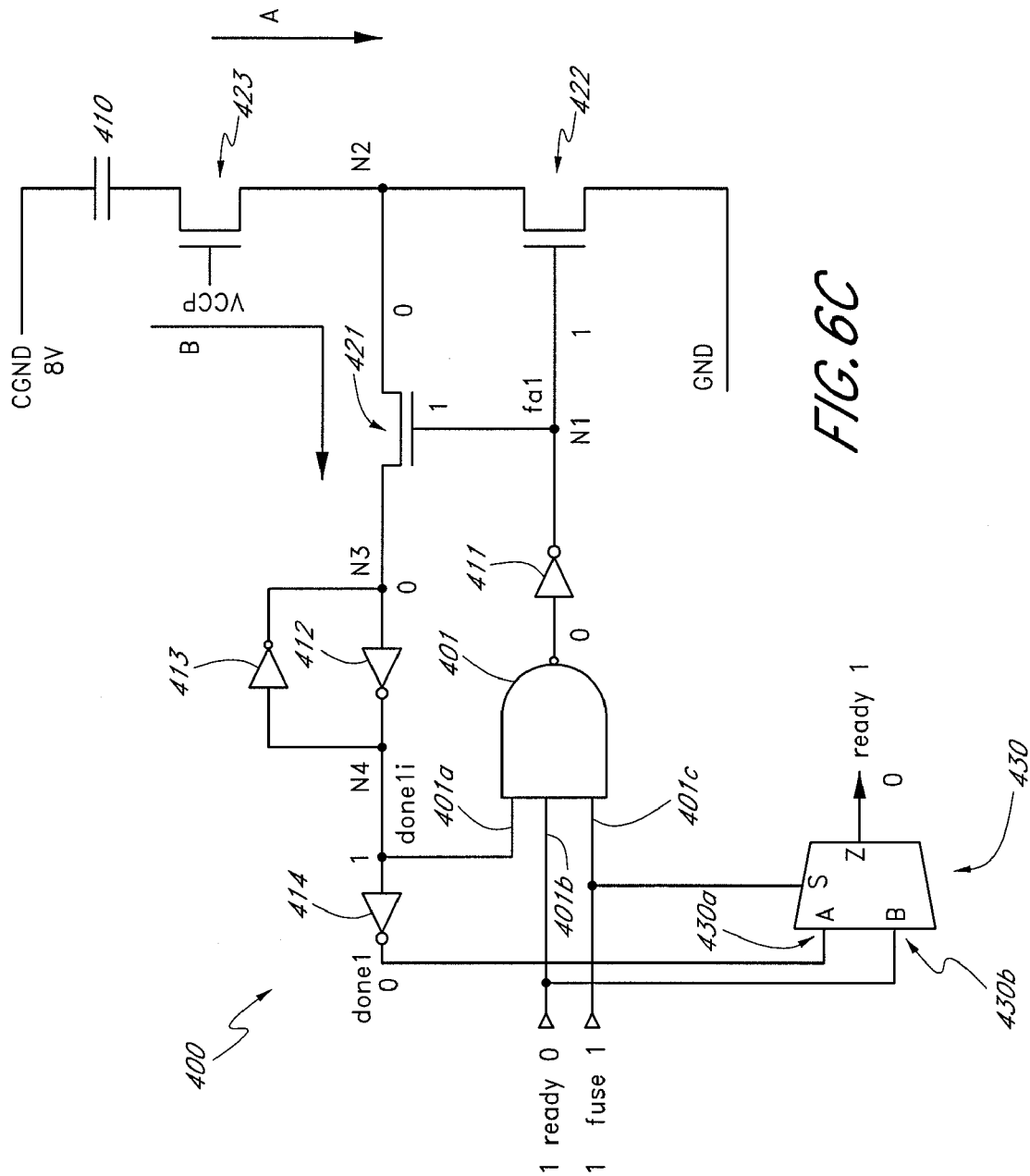

At the next state (FIG. 6B), the CGND node is increased to a blow voltage, e.g., about 8 V. Referring to FIG. 6C, the ready 0 signal is changed to "1," and is applied to the second input 401b of the NAND gate 401. The NAND gate 401 now has all 1s at its three inputs 401a-401c, and thus outputs "0." Then, the first inverter 411 inverts the NAND gate output and generates "1" at its output. Thus, the first node N1 now has a value of "1," which turns on the first and second transistors 421, 422. Now, an electrical path denoted by the arrow A has been established between the CGND node (at about 8 V) and ground GND. In addition, another electrical path denoted by the arrow B has been established between the CGND node and the third node N3. A current starts flowing through the antifuse 410 as the antifuse 410 starts to break down. At this state, the voltage values of the other components remain the same. The output of the multiplexer 430 receives the output of the fourth inverter 414 (at "0") at the first input 430a and the ready 0 signal (at "1") at the second input 430b, and the fuse 1 signal (at "1") at the selector input S thereof. The output Z of the multiplexer 430 still remains at "0."

Figure 6D:
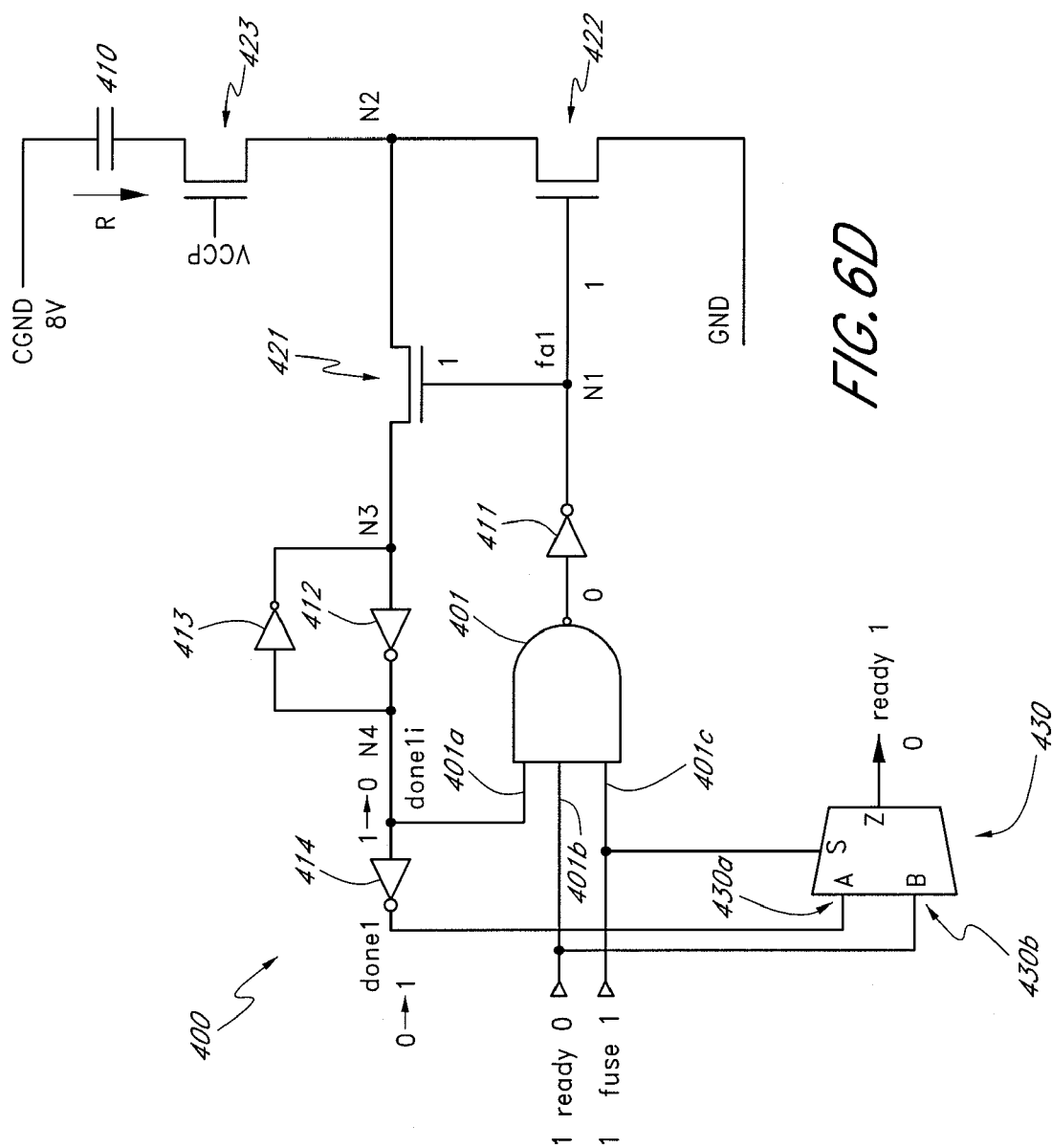

Referring to FIG. 6D, as the antifuse 410 breaks down, the equivalent resistance of the antifuse 410 effectively decreases, and thus the current flowing through the antifuse 410 increases. The antifuse 410, the third transistor 423, and the second transistor 422 are connected in series, and act like a voltage divider. Similarly, the antifuse 410, the third transistor 423, and the first transistor 421 are connected in series, and can act like a voltage divider. The first and second transistor 421, 422 can have some source/drain resistance "RDS ON." Accordingly, the voltage at the second node N2 increases, and thus the voltage at the third node N3 also increases because the first transistor 421 is on. When the voltage at the third node N3 goes up beyond a predetermined value to be detected as "1," the second inverter 412 inverts it to "0," as shown in FIG. 6D. The fourth inverter 414 then inverts the output done1i of the second inverter 412 and generates "1" at its output done 1.

Figure 6E:
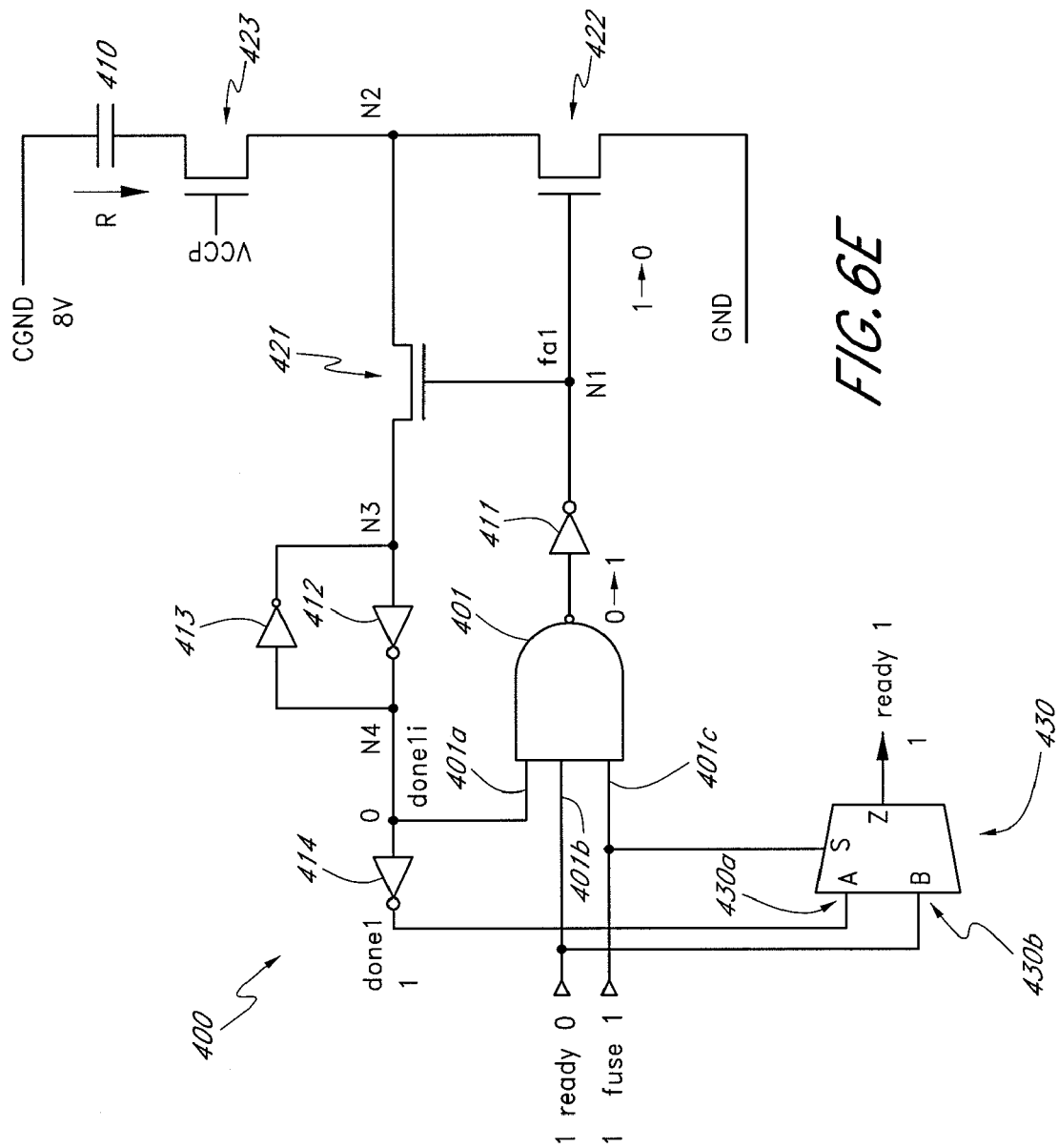

Referring to FIG. 6E, when the output done1 of the fourth inverter 414 flips to "1," the antifuse circuit 410 has finished blowing. Thus, the signals now propagate to turn off the antifuse blowing. The NAND gate 401 generates "1" at its output because the output done1i of the second inverter 412 is now "0." Then, the first inverter 411 inverts the NAND gate output and generates "0" at its output. Thus, the first node N1 has a value of "0." The first and second transistors 421, 422 are turned off at this state, terminating the blowing. The second node N2 remains at "1" because there is an electrically conductive path established between the second node N2 and the CGND node. In one embodiment, the electrically conductive path is deemed to have been established if it has a resistance lower than a predetermined value. In one embodiment, the predetermined value can be less than about 37,500 ohms.

The multiplexer 430 receives the output done1 ("1") of the fourth inverter 414 at the first input 430a thereof. The multiplexer 430 also receives the ready 0 signal ("1") at the second input 430b thereof and the fuse 1 signal ("1") at the selector input S thereof. The multiplexer 430 now generates a ready 1 signal which is "1" at its output Z. See Table 1 above. The ready 1 signal is applied to the second antifuse circuit 440b of FIG. 3 to indicate the completion of the blowing operation.

Figure 6F:
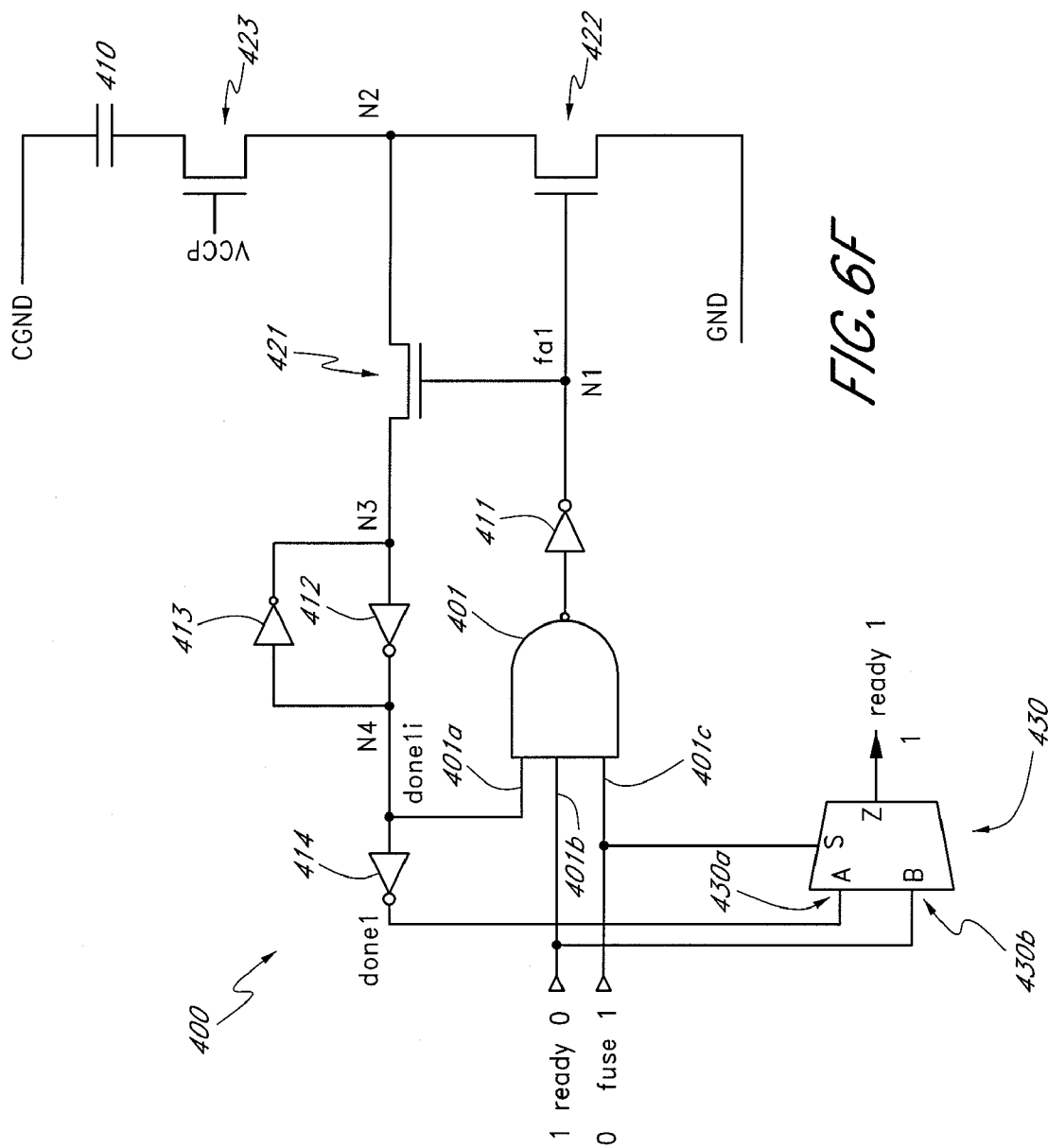

FIG. 6F illustrates the antifuse circuit 400 in the context in which the corresponding antifuse 410 has been selected not to be blown. The illustrated antifuse circuit 400 has been provided with the fuse 1 signal having a value of "0" from the first D flip-flop 330a. The multiplexer 430 receives the fuse 1 signal at the selector input S thereof and selects the B input 430b. At the illustrated state, the ready 0 signal ("1") is applied to the antifuse circuit 400. Upon receiving the ready 0 signal, the multiplexer 430 outputs the ready 1 signal which is "1" at its output, regardless of the value of the output done1 of the fourth inverter 414 (see Table 1 above). In this manner, if the antifuse 410 does not need to be blown, the antifuse circuit 400 can simply pass the ready signal it receives to the next antifuse circuit.

Figure 7:
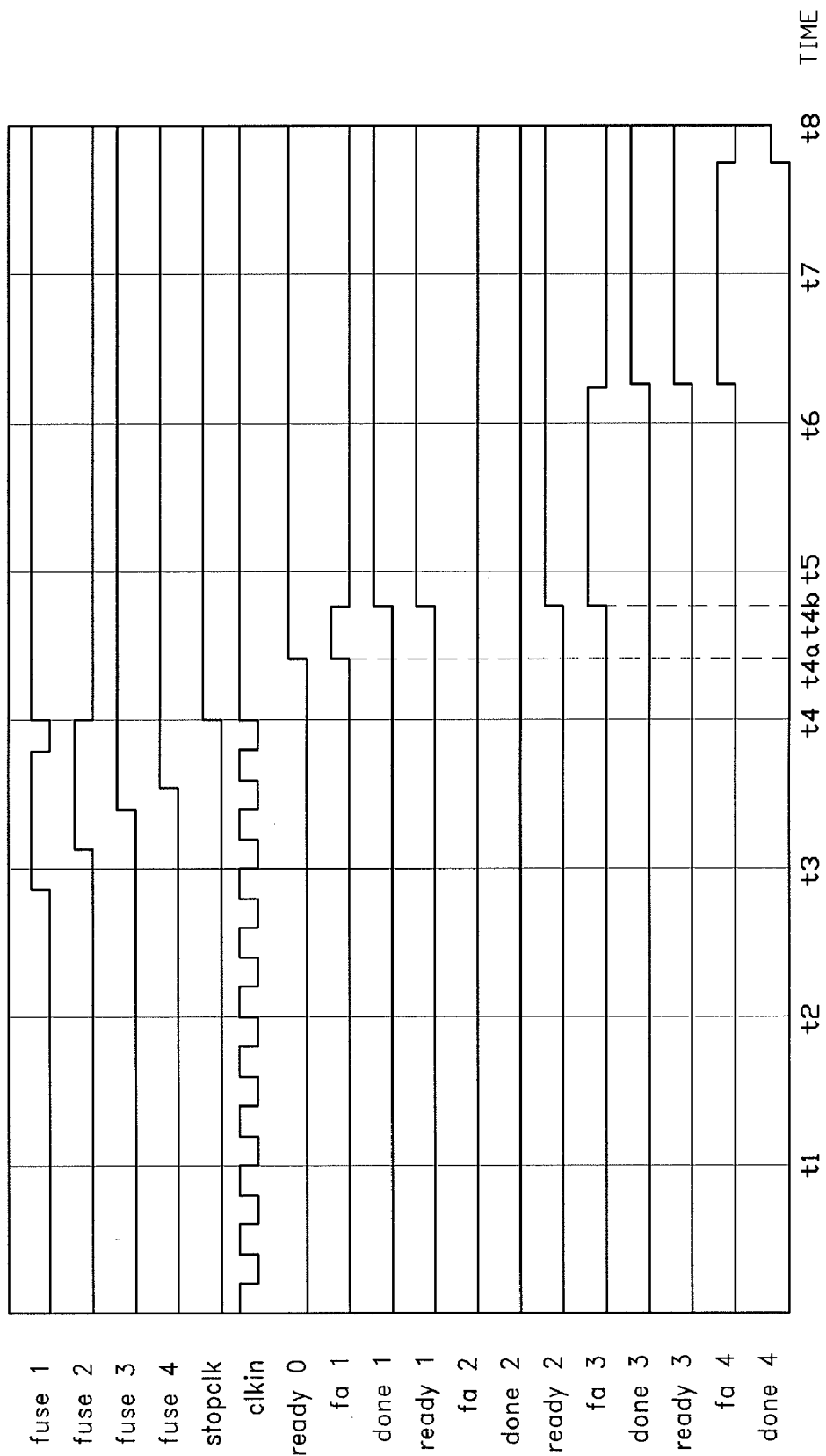
FIG. 7 is a timing diagram illustrating a method of blowing antifuses connected in series in accordance with one embodiment.

FIG. 7 is a timing chart illustrating a method of blowing antifuses connected in series in accordance with one embodiment. In the illustrated embodiment, the antifuse blowing system includes first to four antifuse circuits connected in series, and first to fifth D flip-flops connected to the antifuse circuits in a manner similar to that of FIG. 3.

Referring to FIGS. 3, 4, and 7, fuse signals fuses 1, fuse 2, fuse 3, and fuse 4 are signals input to the first to four antifuses, respectively. A stop clock signal stopclk is an output signal from the last and fifth D flip-flop which is similar to that of the fourth D flip-flop 330d of FIG. 3. A clock-in signal clkin is a signal clocked in to the first inputs of the D flip-flops. Ready signals ready 0 to ready 3 are signals input to the antifuses which trigger the blowing operations. First node signals fa1-fa4 are signals at the first nodes N1 of the antifuses (FIG. 4). Done signals done1-done4 are signals at the outputs of the fourth inverters 414 of the antifuses.

In the illustrated timing chart, the clock-in signal clkin keeps clocking in the sequence indicative of the fuses to be blown. In the illustrated embodiment, a sequence of 1, 1, 1, 0, 1, is applied to the D flip-flops. The sequence indicates that the first, third, and fourth antifuses are to be blown. The first "1" is the stop clock signal to turn off the clock-in signal. When the stop clock signal stopclk rises to "1" at time t4, the clock-in signal clkin stops as shown in FIG. 7 and the following four bits in the sequence are latched at the D flip-flops.

Then, the first antifuse circuit has the fa1 signal increased to "1" while receiving the ready 0 at "1" at time t4a. When the first antifuse has been fully blown, the done1 signal goes high at time t4b, turning off the fa1 signal and sending the ready 1 signal to the second antifuse circuit. Since the second antifuse does not require blowing, the fa2 signal remains low, and it only passes the ready 2 signal to the third antifuse circuit. The third and fourth antifuses are blown in the same manner as that of the first antifuse. When, the fourth antifuse completes blowing, it supplies a blow complete signal to the controller or tester to indicate that the blowing operation has been completed.

Figure 8:
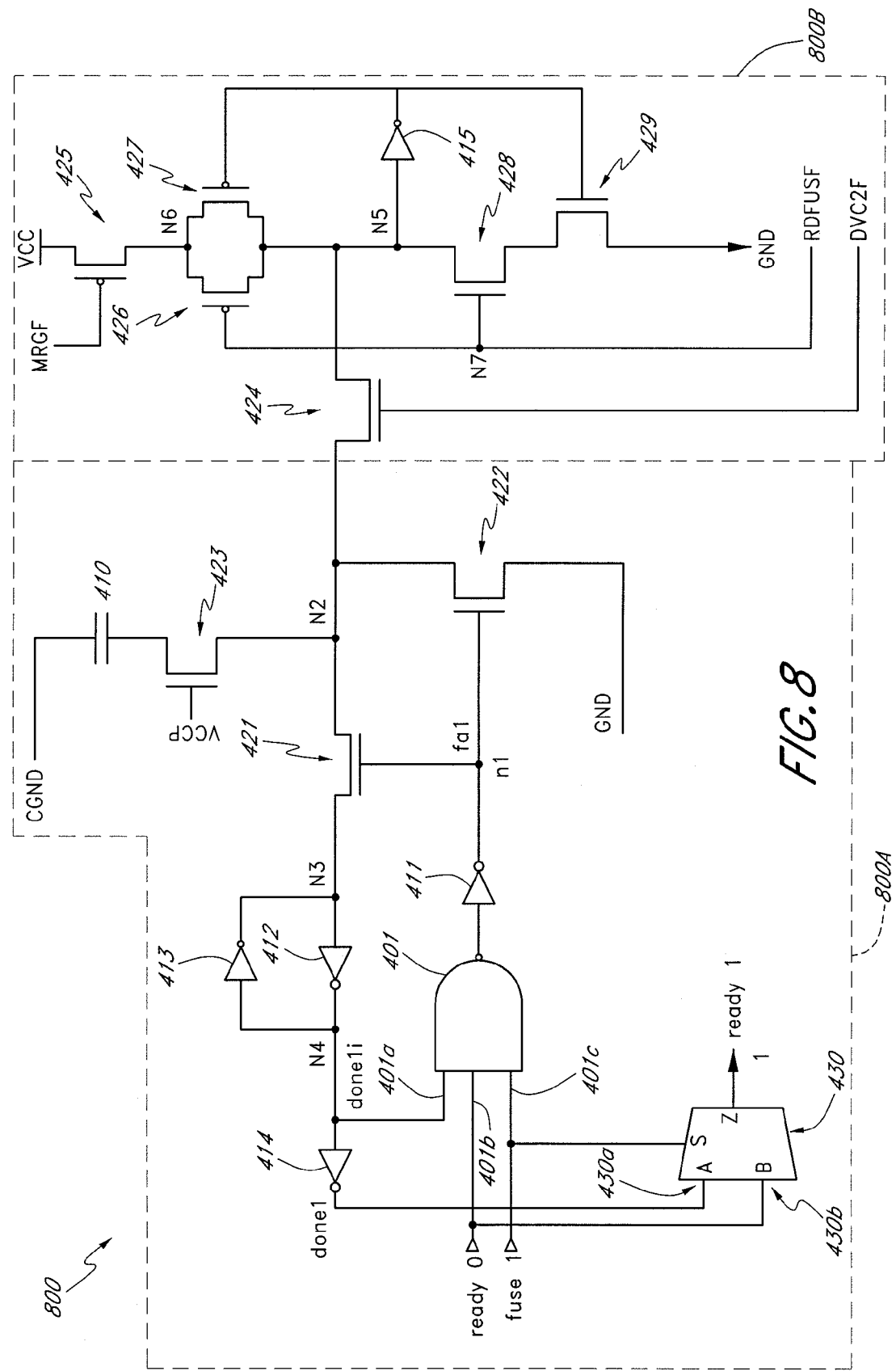
FIG. 8 is a circuit diagram of an antifuse circuit in accordance with another embodiment.

FIG. 8 is a circuit diagram of an antifuse circuit with an interface circuit. The illustrated circuit 800 includes an antifuse circuit 800A and an interface circuit 800B. Any of the antifuse circuits 340a-340c of FIG. 3 can have the configuration of the circuit 800.

The interface circuit 800B serves to latch the state of the antifuse 410. The interface circuit 800B includes a fifth inverter 415, fourth to ninth transistors 424-429, and fifth to seventh nodes N5-N7. The interface circuit 800B can be operably or electrically disconnected from the second node N2 by turning off the fourth transistor 424 while the blowing the antifuse 410.

The fourth transistor 424 serves as a switch between the second node N2 and the fifth node N5. In the illustrated embodiment, the fourth transistor 424 is an N-type MOS transistor. The fourth transistor 424 has a source connected to the fifth node N5, a drain connected to the second node N2, and a gate to receive a latch protect signal DVC2F from the controller or tester (not shown).

The fifth inverter 415 is configured to invert a signal at the fifth node N5 and to provide an output signal to the seventh transistor 427 and the ninth transistor 429. The fifth inverter 415 has an input connected to the fifth node N5, and an output connected to the gates of the seventh and ninth transistors 427, 429.

The fifth transistor 425 serves as a switch between a voltage source VCC and the sixth node N6. In the illustrated embodiment, the fifth transistor 425 is a P-type MOS transistor. The fifth transistor 425 has a source connected to the voltage source VCC, a drain connected to the sixth node N6, and a gate configured to receive an antifuse strength test signal MRGF from the controller or tester (not shown). In one embodiment, the voltage source VCC has a voltage between about 1 V and about 2 V.

The sixth transistor 426 serves as a switch between the fifth and sixth nodes N5 and N6. In the illustrated embodiment, the sixth transistor 426 is a P-type MOS transistor. The sixth transistor 426 has a source connected to the sixth node N6, a drain connected to the fifth node N5, and a gate connected to the seventh node N7. The gate of the sixth transistor 426 is configured to receive a read fuse signal RDFUSF from the controller or tester.

The seventh transistor 427 serves as a switch between the fifth and sixth nodes N5 and N6. In the illustrated embodiment, the seventh transistor 427 is a P-type MOS transistor. The seventh transistor 427 is connected to the sixth transistor 426 in parallel. The seventh transistor 427 has a source connected to the sixth node N6, a drain connected to the fifth node N5, and a gate connected to the output of the fifth inverter 415.

The eighth transistor 428 serves as a switch between the fifth node N5 and the ninth transistor 429. In the illustrated embodiment, the eighth transistor 428 is an N-type MOS transistor. The eighth transistor 428 has a source connected to the fifth node N5, a drain connected to the ninth transistor 429, and a gate connected to the seventh node N7. The gate is configured to receive the read antifuse signal RDFUSF from the controller.

The ninth transistor 429 serves as a switch between the eighth transistor 428 and ground GND. In the illustrated embodiment, the ninth transistor 429 is an N-type MOS transistor. The ninth transistor 429 has a source connected to the drain of the eighth transistor 428, a drain connected to ground GND, and a gate connected to the output of the fifth inverter 415.

In the illustrated embodiment, the transistors 421-429 are either an N-type or P-type transistor. A skilled artisan will appreciate that each of the transistors 421-429 can be of an opposite type from that described above, depending on the design of the circuit. A skilled artisan will also appreciate that the source and drain of each transistor 421-429 can be swapped. Although not shown, the controller or tester (not shown) is configured to provide the power supply for the CGND node and the voltage source VCC. A skilled artisan will appreciate that various configurations of latch circuits can also be adapted for use with the antifuse 800A.

The interface circuit 800B is controlled by the controller or tester. The controller or tester provides digital control logic signals to the interface circuit 800B. The logic signals include the antifuse strength test signal MRGF, the latch protect signal DVC2F, and the read antifuse signal.

The antifuse strength test signal MRGF is an analog signal that controls the sensitivity of the interface circuit 800B. The antifuse strength test signal MRGF is configured to adjust a voltage difference Vds between the source and drain of the fifth transistor 425, thereby controlling the voltage supplied to the fifth node N5.

The latch protect signal DVC2F turns off the fourth transistor 424 to electrically disconnect the interface circuit 800B from the antifuse circuit 800A. The latch protect signal DVC2F is configured to prevent the interface circuit 800B from reading a wrong value from the antifuse 800A and from having excessive current while the antifuse 800A is being blown.

The read antifuse signal RDFUSF is configured to read the antifuse value. The read antifuse signal RDFUSF, while it is low, pre-charges the interface circuit 800B at the fifth node N5 by turning on the sixth transistor 426, and thereby pulls the output of the fifth inverter 415 low. Then, the read antifuse signal RDFUSF goes high, turning off the sixth transistor 426 while turning on the eighth transistor 428. If the antifuse 410 has been blown, the interface circuit 800B is pulled low (the output of the fifth inverter 415 will be pulled high) because the charge at the node N5 flows through the fourth transistor 424, the third transistor 423, and the antifuse 410 to the CGND node which is at 0 V. The output of the fifth inverter 415 turns on the ninth transistor 429 while turning off the seventh transistor 427, thereby pulling the fifth node N5 to ground GND. On the other hand, if the antifuse 410 has not been blown, the interface circuit 800B stays high (the output of the fifth inverter 415 stays low) because the charge at the fifth node N5 remains. The latch protect signal DVC2F can be 0 when the read antifuse signal RDFUSF is 0 to prevent the value of the second node N2 from having contention with the value of the fifth node N5 while precharging.

The illustrated antifuse 800A is blown using transistors such as the first to third transistors 421-423 connected in series and acting as a voltage divider. The voltage divided by the voltage divider is used to flip the second inverter 412. The power supply for the CGND node, the VCCP signal, and the voltage source VCC can be adjusted to make a difference in how much the divided voltage is, resulting in the needed resistance of the antifuse needed to flip the second inverter 412. Table 2 shows simulation data using various levels of VCC, CGND, and VCCP. The antifuse was determined to be blown when it had a resistance of 3,500 ohms in this simulation.

TABLE 2

| R = 3500 ohm, 25 C. | | CGND = 6 V Output voltage (V)/ flip? | CGND = 7 V Output voltage (V)/ flip? | CGND = 8 V Output voltage (V)/flip? |
|---|---|---|---|---|
| VCC = 1.3 V | VCCP = 2.6 V | 1.145/yes | 1.275/yes | 1.315/yes |
|  | VCCP = 2.8 V | 1.200/yes | 1.406/yes | 1.463/yes |
|  | VCCP = 3.0 V | 1.228/yes | 1.516/yes | 1.607/yes |
| VCC = 1.5 V | VCCP = 2.6 V | 0.363/no | 0.572/no | 0.892/yes |
|  | VCCP = 2.8 V | 0.365/no | 0.582/no | 0.931/yes |
|  | VCCP = 3.0 V | 0.366/no | 0.588/no | 0.954/yes |

TABLE 2-continued

| R = 3500 ohm, 25 C. | | CGND = 6 V Output voltage (V)/ flip? | CGND = 7 V Output voltage (V)/ flip? | CGND = 8 V Output voltage (V)/flip? |
|---|---|---|---|---|
| VCC = 1.7 V | VCCP = 2.6 V | 0.234/no | 0.293/no | 0.366/no |
|  | VCCP = 2.8 V | 0.234/no | 0.293/no | 0.368/no |
|  | VCCP = 3.0 V | 0.235/no | 0.294/no | 0.370/no |

The serial antifuse system according to embodiments saves circuit space and logic for addressing a plurality of antifuses. In addition, the serial antifuse system provides self-detective antifuses, thus creating reliable electrical paths while saving antifuse blowing current source and time.

The antifuse systems of the embodiments described above can apply to various electronic devices including semiconductor devices or components. Examples of the electronic devices can include, but are not limited to, consumer electronic products, electronic circuits, electronic circuit components, parts of the consumer electronic products, electronic test equipments, etc. Examples of the electronic devices can also include memory chips, memory modules, receiver circuits of optical networks or other communication networks, and disk driver circuits. The consumer electronic products can include, but are not limited to, a mobile phone, a telephone, a television, a computer monitor, a computer, a handheld computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

One embodiment is a semiconductor device including a plurality of latch devices operatively coupled in series from input to output. The latch devices are configured to hold programming data for antifuses. The semiconductor device also includes a plurality of antifuse circuits. The antifuse circuits are configured to receive an output signal from a corresponding one of the latch devices for programming of a corresponding antifuse.

Another embodiment is a method of programming antifuses. The method includes providing a plurality of antifuse circuits operatively coupled in series from input to output. The antifuse circuits are configured to blow a corresponding antifuse. A sequence of bits is received at a plurality of latch devices. The sequence is indicative of which antifuses are to be blown. The antifuses are blown sequentially based on the sequence.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A semiconductor device comprising:
a plurality of latch devices operatively coupled in series from input to output, the latch devices being configured to hold programming data for antifuses; and
a plurality of antifuse circuits, the antifuse circuits being configured to receive an output signal from a corresponding one of the latch devices for programming of a corresponding antifuse,
wherein the latch devices are configured to hold a sequence of bits, the sequence being indicative of which antifuses are to be blown,
wherein the latch devices are configured to form a serial data flow passing therethrough in synchronization with a clock,
wherein the latch devices comprise a first latch device and a last latch device in the serial data flow, and
wherein the first latch device is configured to receive the sequence until the last latch device outputs a first bit of the sequence as a stop signal.

2. The device of claim 1, wherein the semiconductor device is a memory device comprising a plurality of memory cells, wherein at least one of the antifuse circuits is configured to blow the corresponding antifuse to repair a failed one of the memory cells by remapping.

3. The device of claim 2, wherein the memory device comprises a dynamic random access memory (DRAM).

4. The device of claim 1, wherein the plurality of latch devices comprises a plurality of D flip-flops.

5. The device of claim 4, wherein the D flip-flops are configured to hold the sequence such that corresponding bits in the sequence are held at the antifuses.

6. The device of claim 5, wherein the corresponding bits in the sequence do not include the first bit of the sequence.

7. The device of claim 6, wherein the corresponding bits in the sequence are in the reverse order from an order in which the antifuses are arranged along the serial data flow.

8. A semiconductor device comprising:
a plurality of latch devices operatively coupled in series from input to output, the latch devices being configured to hold programming data for antifuses; and
a plurality of antifuse circuits, the antifuse circuits being configured to receive an output signal from a corresponding one of the latch devices for programming of a corresponding antifuse,
wherein the plurality of latch devices comprises a plurality of D flip-flops,
wherein the D flip-flops are configured to hold a sequence of bits, the sequence being indicative of which antifuses are to be blown, and
wherein the antifuse circuits are configured to determine whether the corresponding antifuse has been blown.

9. The device of claim 8, wherein the antifuse circuits are configured to activate a ready signal at least partially in response to the determination of whether the corresponding antifuse has been blown.

10. The device of claim 9, wherein the plurality of D flip-flops comprises a first D flip-flop and a second D flip-flop, the first D flip-flop being configured to generate a first output signal, the second D flip-flop being configured to generate a second output signal, the second D flip-flop being configured to receive the first output signal;
wherein the plurality of antifuse circuits comprises a first antifuse circuit and a second antifuse circuit, the first antifuse circuit being configured to receive the first output signal, the second antifuse circuit being configured to receive the second output signal;
wherein the first antifuse circuit is further configured to provide a first ready signal to the second antifuse circuit;
wherein the second antifuse is further configured to initiate an antifuse blowing operation upon receiving the first ready signal.

11. The device of claim 10, wherein each of the first and second antifuse circuits comprises:
a first node;
a second node;
a first transistor including a first source, a first drain, and a first gate, the first source being connected to the second node, the first gate being connected to the first node;
a second transistor including a second source, a second drain, and a second gate, the second source being connected to the second node, the second gate being connected to the first node;
a third transistor including a third source, a third drain, and a third gate, the third drain being connected to the second node; and
an antifuse including a first terminal and a second terminal, the second terminal being connected to the third source.

12. The device of claim 11, wherein each of the first and second antifuse circuits further comprises:
a third node, wherein the first drain of the first transistor is connected to the third node;
a fourth node;
a first inverter including a first input and a first output, the first output being connected to the first node;
a second inverter including a second input and a second output, the second input being connected to the third node, the second output being connected to the fourth node;
a third inverter including a third input and a third output, the third input being connected to the fourth node, the third output being connected to the third node; and
a fourth inverter including a fourth input and a fourth output, the fourth input being connected to the fourth node.

13. The device of claim 12, wherein each of the first and second antifuse circuits further comprises:
a NAND gate having a first gate input, a second gate input, a third gate input, and a gate output, the first gate input being connected to the fourth node, the gate output being connected to the first input of the first inverter; and
a multiplexer having a first multiplexer input, a second multiplexer input, a selector input, and a multiplexer output, the first multiplexer input being connected to the fourth output of the fourth inverter, the second multiplexer input being connected to the second gate input, the selector input being connected to the third gate input.

14. The device of claim 13, wherein the second gate input of the second antifuse circuit is connected to the multiplexer output of the first antifuse circuit, wherein the third gate input of the second antifuse is configured to receive the second output signal from the second D flip-flop.

15. A method of programming antifuses, the method comprising:
providing a plurality of antifuse circuits operatively coupled in series from input to output, the antifuse circuits being configured to blow a corresponding antifuse;
receiving a sequence of bits at a plurality of latch devices, the sequence being indicative of which antifuses are to be blown;
holding the sequence of bits at the antifuse circuits such that corresponding ones of the bits in the sequence are held at the antifuse circuits; and
blowing the antifuses sequentially based on the sequence, wherein holding the sequence comprises passing the sequence through the latch devices in synchronization with a clock so as to form a serial data flow, and wherein the sequence is passed until a last latch device in the serial data flow outputs a first bit of the sequence as a stop signal.

16. The method of claim 15, wherein holding the sequence of bits comprises holding the sequence sequentially using a plurality of D flip-flops.

17. The method of claim 15, wherein the corresponding bits in the sequence do not include the first bit of the sequence.

18. The method of claim 17, wherein the corresponding bits in the sequence are in the reverse order from an order in which the antifuses are arranged along the serial data flow.

19. A method of programming antifuses, the method comprising:
providing a plurality of antifuse circuits operatively coupled in series from input to output, the antifuse circuits being configured to blow a corresponding antifuse;
receiving a sequence of bits at a plurality of latch devices, the sequence being indicative of which antifuses are to be blown; and
blowing the antifuses sequentially based on the sequence, wherein blowing the antifuses comprises:
activating a ready signal for one of the antifuse circuits;
blowing the corresponding antifuse of the antifuse circuit;
determining whether the corresponding antifuse has been blown; and
activating another ready signal at least partially in response to the determination of whether the antifuse has been blown.

20. The method of claim 19, wherein the plurality of antifuse circuits comprises a first antifuse circuit and a second antifuse circuit configured to receive a ready signal from the first antifuse circuit, wherein the sequence indicates that the corresponding antifuse of the first antifuse circuit is to be blown, wherein blowing the antifuses comprises:
activating a first ready signal to the first antifuse circuit;
blowing the corresponding antifuse of the first antifuse circuit;
activating a second ready signal upon completion of blowing the corresponding antifuse of the first antifuse circuit; and
providing the second ready signal to the second antifuse circuit.

21. The method of claim 19, wherein the plurality of antifuses comprises a first antifuse circuit and a second antifuse circuit configured to receive a ready signal from the first antifuse circuit, wherein the sequence indicates that the corresponding antifuse of the first antifuse circuit is not to be blown, wherein blowing the antifuses comprises:
activating a first ready signal to the first antifuse circuit;
activating a second ready signal without blowing the corresponding antifuse of the first circuit; and
providing the second ready signal to the second antifuse circuit.

22. A semiconductor device comprising:
a plurality of latch devices operatively coupled in series from input to output, the latch devices being configured to hold programming data for antifuses; and
a plurality of antifuse circuits, the antifuse circuits being configured to receive an output signal from a corresponding one of the latch devices for programming of a corresponding antifuse,
wherein the antifuse circuits are configured to determine whether the corresponding antifuse has been blown.

* * * * *